United States Patent
Hikita et al.

[11] Patent Number: 5,666,091
[45] Date of Patent: Sep. 9, 1997

[54] STRUCTURE OF SURFACE ACOUSTIC WAVE FILTER

[75] Inventors: Mitsutaka Hikita, Hachioji; Kazuyuki Sakiyama, Chigasaki; Nobuhiko Shibagaki, Kodaira, all of Japan

[73] Assignee: Hitachi Media Electronics Co., Ltd., Iwate, Japan

[21] Appl. No.: 618,118

[22] Filed: Mar. 19, 1996

[30] Foreign Application Priority Data

Mar. 20, 1995 [JP] Japan ................ 7-060306

[51] Int. Cl.$^6$ .................................... H03H 9/04
[52] U.S. Cl. ................. 333/193; 310/313 A; 310/313 R
[58] Field of Search .................. 333/193–196; 310/313 R, 313 B, 313 C, 313 D, 313 A

[56] References Cited

U.S. PATENT DOCUMENTS

| | | | |
|---|---|---|---|
| 3,868,608 | 2/1975 | Williams | 333/193 |
| 4,006,290 | 2/1977 | Momberger et al. | 333/193 |
| 4,492,940 | 1/1985 | Hikita | 333/193 |
| 4,516,093 | 5/1985 | Nyffler | 333/194 |
| 5,087,901 | 2/1992 | Kurosawa et al. | 333/193 |
| 5,175,519 | 12/1992 | Yatsuda et al. | 333/194 |
| 5,179,310 | 1/1993 | Satoh et al. | 333/193 |
| 5,300,902 | 4/1994 | Satoh et al. | 333/193 |
| 5,309,126 | 5/1994 | Allen | 333/193 |
| 5,463,361 | 10/1995 | Allen | 333/193 |

FOREIGN PATENT DOCUMENTS

| | | | |
|---|---|---|---|
| 61-92022 | 5/1986 | Japan | 333/193 |
| 3-40510 | 2/1991 | Japan | 333/193 |

OTHER PUBLICATIONS

IEEE Transactions On Vehicular Technology, vol. 38, No. 1, Feb. 1989, "Miniaturized SAW Devices for Radio Communication Transceivers", by Hikita et al, pp. 2–8.

*Primary Examiner*—Benny Lee
*Assistant Examiner*—Darius Gambino
*Attorney, Agent, or Firm*—Fay, Sharpe, Beall, Fagan, Minnich & McKee

[57] ABSTRACT

Without increasing propagation loss or diffraction loss, (unlike conventional surface acoustic wave, SAW, filters which need many electrode finger pairs for constructing interdigital transducers, IDTs, to realize a steep cutoff frequency characteristic by conventional weighting or apodization that involves a high propagation loss and a high diffraction loss), there is provided a SAW filter with a very steep cutoff frequency characteristic on the low frequency side which uses three IDTs having N1, N2 and N3 electrode finger pairs, respectively. The filter is particularly applicable to a mobile radio communication device, such as a cellular radio. The relation between all the number of pairs N1+N2+N3 of the IDTs and the electromechanical coupling coefficient $k^2$ of the piezoelectric substrate is $N2<(N1+N3)<3\times N2$, and $2/k^2 \geq (N1+N2+N3) \geq 0.8/k^2$.

17 Claims, 11 Drawing Sheets

Fig.3
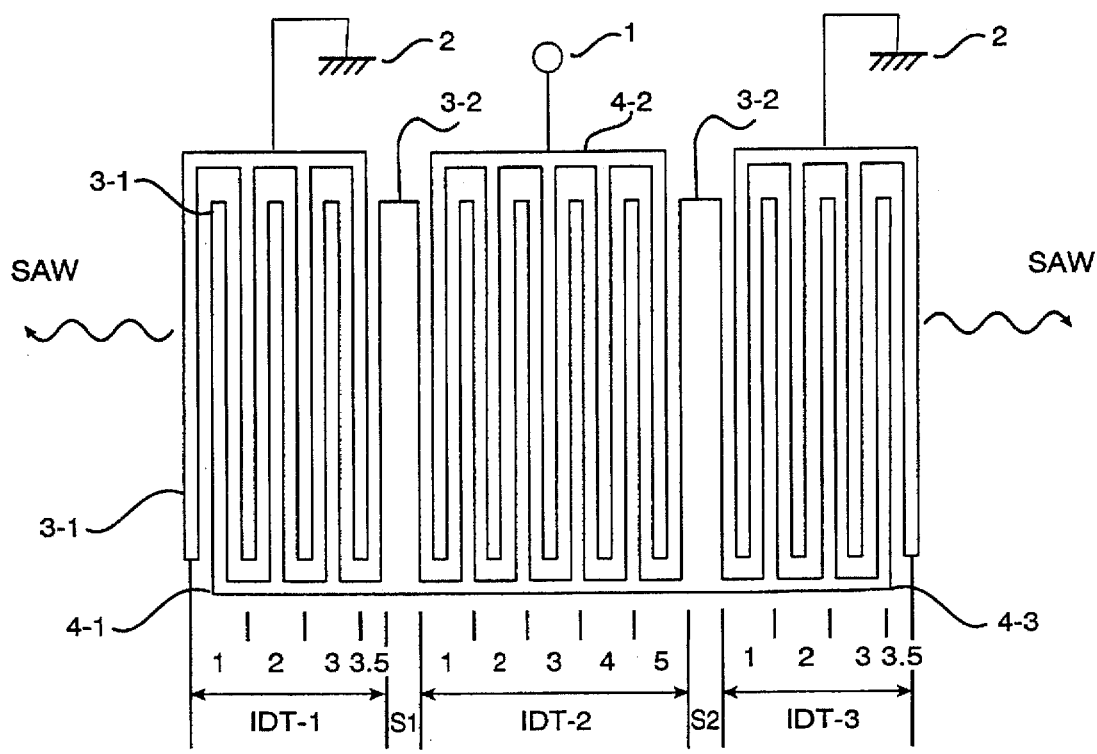
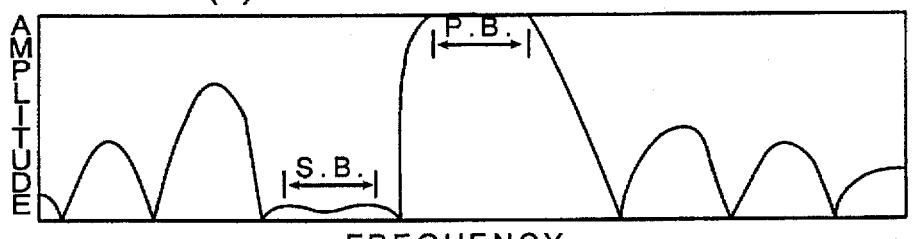
FIG. 4(a)
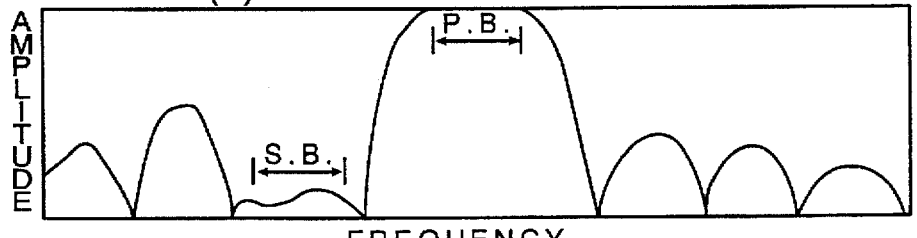
FIG. 4(b)
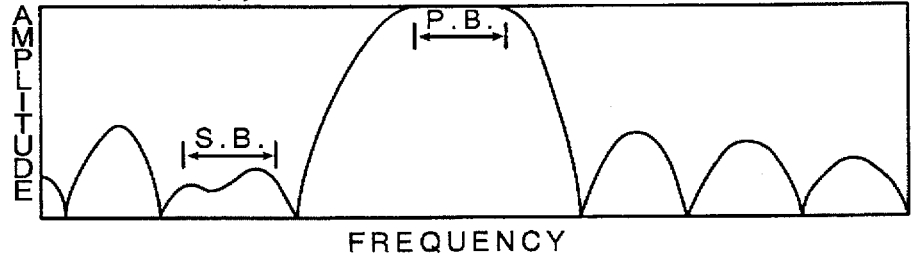
FIG. 4(c)

STRUCTURE OF SURFACE ACOUSTIC WAVE FILTER

BACKGROUND OF THE INVENTION

The present invention relates to a surface acoustic wave filter having interdigitalized fingers, and more specifically to a small-size high-performance high-frequency filter required for radio communication devices, at a high productivity as a transducer for exciting or receiving a surface acoustic wave (hereafter referred to as a SAW).

A known high-frequency filter combines a coil and a capacitor. Recently mobile radio communication devices employ cascade connecting dielectric resonators instead of the coil and capacitor for necessary frequency characteristics. However, there is a major objective to downsize such a high-frequency filter to make it suitable for a mobile radio communication terminal, which is strongly desired, because the type of circuit is a hybrid circuit or three-dimensional circuit.

A filter using SAWs is superior for mass productivity, because it is small in size and it can be produced by semiconductor process techniques. The prior art filter using SAWs is inferior to a conventional dielectric resonator type filter in view of the pass band loss and a steep cutoff frequency characteristic between the pass band and a stop band, however.

SUMMARY OF THE INVENTION

The present invention overcomes prior art problems of a surface acoustic wave (SAW) filter, particularly a dielectric resonator type filter, by providing a very steep cutoff frequency characteristic with a loss characteristic compatible with the steep cutoff frequency characteristic.

The present invention includes the following analysis of a conventional SAW filter that excites or receives a SAW by using an interdigital transducer (IDT), as shown in FIG. 1, where electrode fingers 3 are interdigitated. The SAW filter has voltage applied across input 1 and the earth 2. The filter comprises at least one exciting IDT and one receiving IDT. The product of frequency characteristics of the exciting and receiving IDTs is almost the frequency characteristic of the SAW filter. The frequency characteristics of the IDTs are deformed by weighting or the like so that a desired frequency characteristic is obtained. A very steep frequency characteristic required for mobile radio communication is obtained by weighting the characteristics, but an extremely large number of electrode finger pairs must be provided in the IDTs and as a result the distance between the exciting IDT and the receiving IDT increases very much. Therefore, due to such increased distance, the propagation loss or diffraction loss of SAWs cannot be ignored, and such losses result in increased filter loss.

In general, SAWs are excited at the right and left of an IDT by forming N pairs of IDTs (N=10 in FIG. 1) on the surface of a piezoelectric substrate and applying a voltage to the input electric terminal 1. However, the filter frequency characteristics have a lot of side lobes with very high levels present on both sides of the main lobe as shown by the graph of FIG. 2. The main lobe of FIG. 2 represents the pass band (P.B.) of the filter. One of the criteria showing the quality of a SAW filter is how much the side lobe levels can be lowered. In particular, the side lobes on both sides of the main lobe and which are the closest to the main lobe generally have high levels in the prior art. How to lower the levels of the side lobes is an important point for a SAW filter.

A SAW filter which used IDTs having the structure of FIG. 3 and satisfying the relation $N2=N1+N3$ with a view to enhancing the impedance of the IDTs, is disclosed on pages 2 to 8, IEEE Transactions on Vehicular Technology, Vol. 38, No. 1, February 1989, and entitled "Miniaturized SAW Devices for Radio Communication Transceivers", by Hikita et al. In this paper, $N2=0.5N1$ and $0.5N3$ to provide symmetrical frequency characteristics, and no consideration was taken of the relation between the numbers of pairs N1, N2 and the number of pairs N3 of the individual IDTs and the entire frequency characteristics of the IDTs. The present inventors have examined, by computer simulations and fundamental experiments, the structure and operation of such a filter, and they have devised very steep cutoff characteristics, which are recently required, especially by digital cellular radio systems. Specifically, these characteristics can be achieved by setting the relations between $N1+N3$ and $N2$ and the relations between $N1+N2+N3$ and the electromechanical coupling coefficient $k^2$ of the piezoelectric substrate used, within predetermined ranges. Here, the electromagnetic coupling coefficient $k^2$ is defined by $k^2=2(Vf-Vm)/Vf$ where Vm is the propagation velocity of the SAW in a state that the surface of the piezoelectric substrate is uniformly coated with a metal thin film forming the IDTs, and Vf is the propagation velocity of the SAW in a state of a free surface, that is the surface is not coated with the metal thin film.

As shown in FIG. 3, IDT-1, IDT-2 and IDT-3 having N1, N2 and N3 electrode finger pairs, respectively, are arranged in the direction of propagation of SAWs. To solve the above problems, the IDT-1 is electrically connected to the IDT-3 in parallel, and the central IDT-2 is connected in series to each of IDT-1 and ITD-3.

A voltage applied between an electric terminal 1 and ground 2 is divided between the parallel connected IDT1, IDT3 and the IDT2 connected in series. The voltage dividing ratio is almost determined by the number of electrode finger pairs of the IDTs. IDTs connected in parallel contribute in terms of the sum of the number of electrode finger pairs $N1+N3$. That is, the voltage dividing ratio is determined by the ratio of $N1+N3$ to $N2$.

It is an object of the present invention to use the above new analysis, which analysis is a part of the present invention, particularly, to overcome these problems with the embodiment to be described in detail as follows.

As a result of the present inventor's detailed study using $LiNbO_3$, $LiTaO_3$, $Li_2B_4O_7$, quartz, or a ZnO film formed on a nonpiezoelectric substrate serving as a substrate frequently used at present, it has been found that the frequency characteristic of an IDT is greatly influenced by changing the relation between $N1+N3$ and $N2$. That is, it is possible to realize an attenuation characteristic having a very steep cutoff frequency characteristic in a specified frequency band with hardly influencing the characteristic of the pass band of a filter by changing $N1+N3$ in a certain range specified by $N2$. This is because the voltage dividing ratio determined by the relation between $N1+N3$ and $N2$ and the phase relation of SAWs excited by the IDT-1, IDT-2, and IDT-3 arranged in the direction of propagation of the SAWs have a complex relation and resultingly, a very steep cutoff attenuation characteristic can be realized in a specific frequency band.

The values of $k^2$ as well as the minimum and maximum values of N1, N2 and N3 are determined by the piezoelectric substrate. If a wide band is desired, then there are a fewer number of fingers used in the SAW filter and vise versa. Generally, N1 and N3 are incremented in ½ units, while N2 increases in whole number units.

A point of this invention is that (N1+N3)=K×N2, wherein K is a constant. The range of K is decided so that the pass band lobe has a steep rise and is closely adjacent the side stop band in terms of frequency. As K increases, the slope of the pass band decreases thereby separating the frequencies and the stop band rises so there is little difference between the two.

However, these very steep cutoff attenuation characteristics closely depend upon the intensity of the piezoelectric effect of the piezoelectric substrate used. In other words, it is necessary to set the relation between all the number of pairs, N1, N2, N3 of the IDTs and the $k^2$ of the piezoelectric substrate within an adequate range.

BRIEF DESCRIPTION OF THE DRAWINGS

Further objects, features and advantages of the present invention will become more clear from the following detailed description of a preferred embodiment, described with respect to the accompanying drawing:

FIG. 3 shows the structure of a SAW exciting or receiving IDT, which is analyzed according to the present invention;

FIGS. 4(a), (b) and (c) show the frequency characteristics of the amplitude of an SAW excited by the SAW exciting or receiving IDT of a basic element of the present invention;

DETAILED DESCRIPTION OF THE PREFERRED EMBODIMENTS

Figure 1:
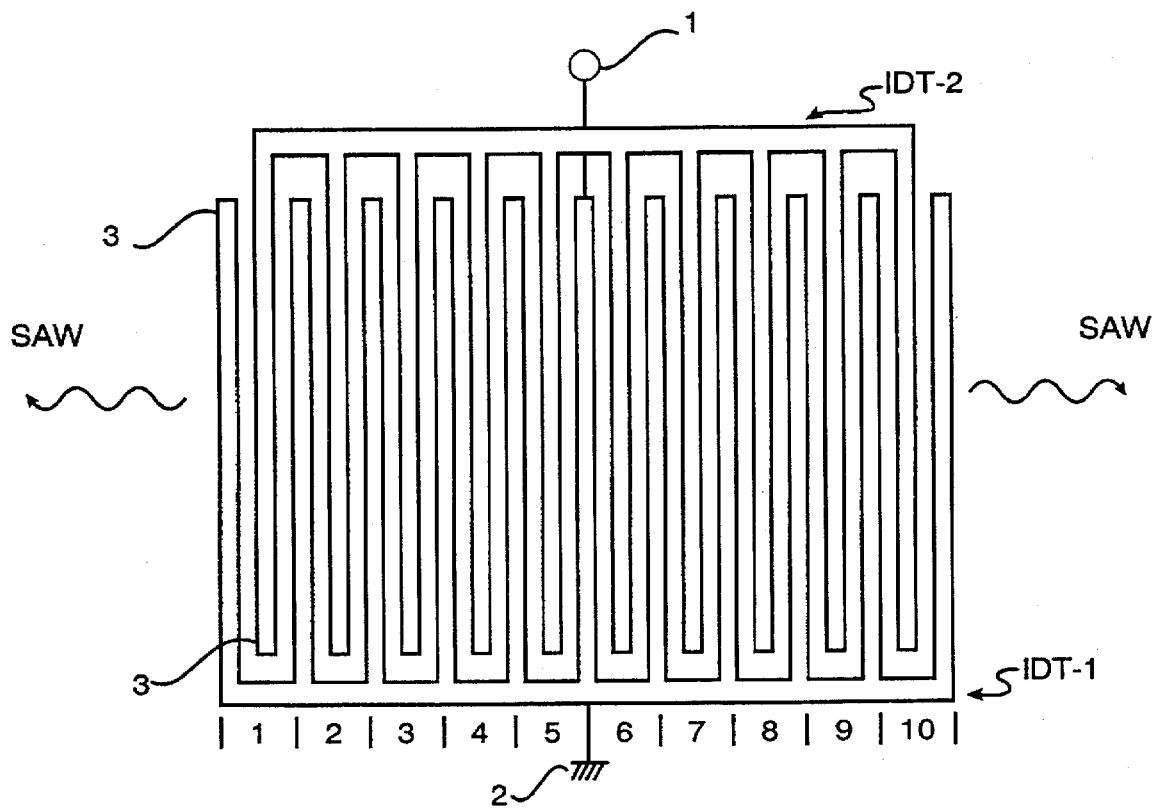
FIG. 1 shows the structure of a conventional SAW exciting or receiving IDT.

The present inventor has found that the frequency characteristic of an IDT is greatly influenced by changing the relation between (N1+N3) and N2. The attenuation characteristic has a very steep cutoff frequency characteristic in a specified frequency band while hardly influencing the characteristic of the filter pass band by changing (N1+N3) in a certain range specified relative to N2. The voltage dividing ratio is determined by the relation between (N1+N3) and N2. The phase relation of SAWs excited by the IDT-1, IDT-2 and IDT-3 arranged in the direction of propagation of the SAWs have a complex relation. The invention has identified relations where a very steep cutoff attenuation characteristic is realized in a specific frequency band. In short, the IDT-1, IDT-2 and IDT-3 are arranged in this mentioned order from the lefthand, as shown. The IDT-1, located at the lefthand side, is electrically connected to the IDT-3, located at the righthand side.

The present inventors particularly have devised a new IDT structure capable of lowering the amplitude levels of the side lobes closest to the pass band main lobe. The filter is preferably formed on a piezoelectric single-crystal substrate made of lithium niobate ($LiNbO_3$), lithium tantalate ($LiTaO_3$), lithium tetraborate ($Li_2B_4O_7$) or quartz, or formed on a piezoelectric substrate in which a zinc oxide (ZnO) film is formed on a nonpiezoelectric substrate; and the filter is preferably for converting electric signals into SAWs or SAWs into electric signals.

In FIG. 3, N1=3.5, N2=5, and N3=3.5. Though the spaces (S1 and S2 in FIG. 3) between IDT-1 and IDT-2 and between IDT-2 and IDT-3 can be set to any values, the spaces are generally set to values approximately one-half the wavelength of the SAW as determined by the frequency where the amplitude of the SAW excited by an IDT is a maximum, that is, as determined by the center frequency of the main lobe.

As a result of basic experiments and computer simulations, characteristics have been found between a relationship of (N1+N3) and N2, and the amplitude of the excited SAW, as seen in FIGS. 4(a), 4(b), and 4(c).

FIG. 4(a) shows the case in which the value $k^2$ of the piezoelectric substrate=0.06, N1=5.5, N2=9 and N3=5.5, i.e., (N1+N3)=1.2×N2, as an example. It is seen that the level of the side lobe closest to the main lobe on the low frequency side of the main lobe is lowered greatly. The main lobe corresponds to the pass band (P.B.) and the side lobe with the low level corresponds to the stop band (S.B.). Therefore, the stop band is formed in a frequency band very close to the pass band on the low frequency side of the pass band. By comparing the characteristic in FIG. 4(a) with that in FIG. 2, it is understood that the cutoff frequency characteristic on the low frequency side is very steep for the present invention (the examples use new relationships of K, N) as compared to the prior art.

FIG. 4(b) shows the case where $k^2$=0.06, N1=8.5, N2=9, N3=8.5, and (N1+N3)=1.9×N2. In comparison with FIG. 4(a), the interval between the pass band and the stop band slightly increases and the side lobe of the pass band on the low frequency side is sufficiently small.

FIG. 4(c) shows the case where $k^2$=0.06, N1=10.5, N2=8, N3=10.5, and (N1+N3)=2.6×N2. The interval between the pass band and the stop band further increases and the side lobe of the pass band on the low frequency side is also suppressed in comparison with FIGS. 4(a) and 4(b).

According to the invention, the basic structure is such that N2<(N1+N3)<3×N2, to greatly lower the level of a side lobe on the low frequency side of the main lobe in the SAW excited by the IDTs.

FIG. 4(a) shows a very steep cutoff frequency characteristic on the low frequency side of the main lobe. However, as shown in FIG. 4(a), the levels of side lobes present on the low-frequency side of the stop band are extremely high and thereby, the practical value of the filter is lost unless a measure for reducing these side lobes is taken.

When (N1+N3)>3×N2, the interval between the pass band and the stop band further increases and the effect of reducing the side lobes in the stop band is weakened; FIG.

Figure 2:
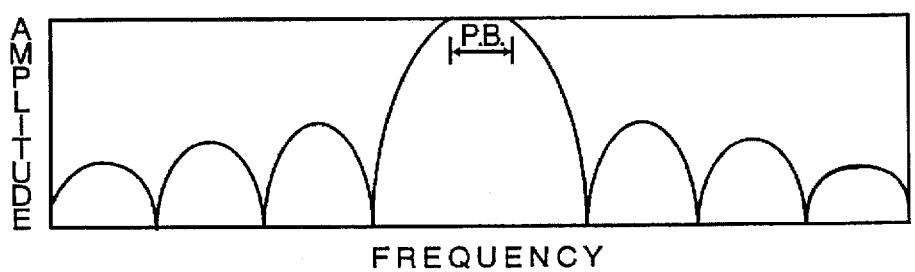
FIG. 2 is a diagram showing the frequency characteristic of the amplitude of an SAW excited by a conventional SAW exciting or receiving IDT.

4(c) shows such a tendency. Therefore, from the tendency found in comparing FIGS. 4a–4c, when N1+N3>3×N2, only a result similar to that of a conventional simple IDT of FIGS. 1 and 2 is predicted to be obtained with respect to the side lobes.

In the range of N2<(N1+N3)<3×N2, as described above, the side lobes at the low-frequency side of the pass band can be suppressed. The reason for this suppression will be described in the following. Specifically, the voltage dividing ratio, determined by the relation between (N1+N3) and N2, and the phase relation of the SAW excited by the IDT-1, IDT-2 and IDT3 arranged in the propagation direction of the SAW, are correlated in a complicated manner to reduce the amplitude of the side lobes on the low-frequency side by their interactions.

However, the following results have been found out by the fundamental experiments which were actually conducted by the present inventors using computer simulations with respect to various piezoelectric substrates. Specifically, the above-specified phenomena highly depend upon the intensity of the piezoelectric effect of the piezoelectric substrate used. The intensity of the piezoelectric effect is expressed by using the electromechanical coupling coefficient $k^2$. In piezoelectric substrates used generally in the art, the coefficient $k^2$=0.11 for 64° YX-LiNbO$_3$; $k^2$=0.16 for 41° YX-LiNbO$_3$; $k^2$=0.053 for 36° YX-LiTaO$_3$; and $k^2$=0.001 for ST cut quartz.

The relation between (N1+N3) and N2 and the relations between the various coefficients $k^2$ and (N1+N2+N3) have been examined. The results of the examination have revealed that the aforementioned phenomena require a range of $2/k^2 \geq (N1+N2+N3) \geq 0.8/k^2$.

It has been found that when all the number of pairs of the IDTs are large and that $2/k^2$<(N1+N2+N3), characteristic similar to the frequency characteristics shown in FIGS. 4(a), 4(b) and 4(c) can be achieved from the relation between (N1+N3) and N2, but that a large ripple is produced in the pass band of the filter, so that the filter loses its practical value. This is because more multiple reflections of the SAW occur for larger coefficient $k^2$ between the electrode fingers of the IDTs, due to the large numbers of the IDTs. As described before, therefore, a large ripple is caused not only by the interactions between the SAWs produced by the IDT-1, IDT-2 and IDT-3, but also by the complicated interactions called multiple reflections.

When, on the other hand, all the numbers of pairs of the IDTs are small and (N1+N2+N3)<0.8/$k^2$, little change is made in the frequency characteristics no matter how the relation between (N1+N3) and N2 might be changed. In short, there is achieved no frequency characteristics shown in FIGS. 4(a), 4(b) and 4(c). This will be explained in the following. The interactions among the SAWs excited by the IDT-1, IDT-2 and IDT-3 are lower for smaller coefficient $k^2$. Thus, similar effects can be equivalently achieved even for small coefficient $k^2$ by increasing all the number of pairs of N1+N2+N3 of the IDTs to elongate the interaction range. However, it has also been found that the value (N1+N2+N3)=0.8/$k^2$ for a given coefficient $k^2$ indicates the limit value to which all the numbers of the IDTs can be reduced.

Figure 5:
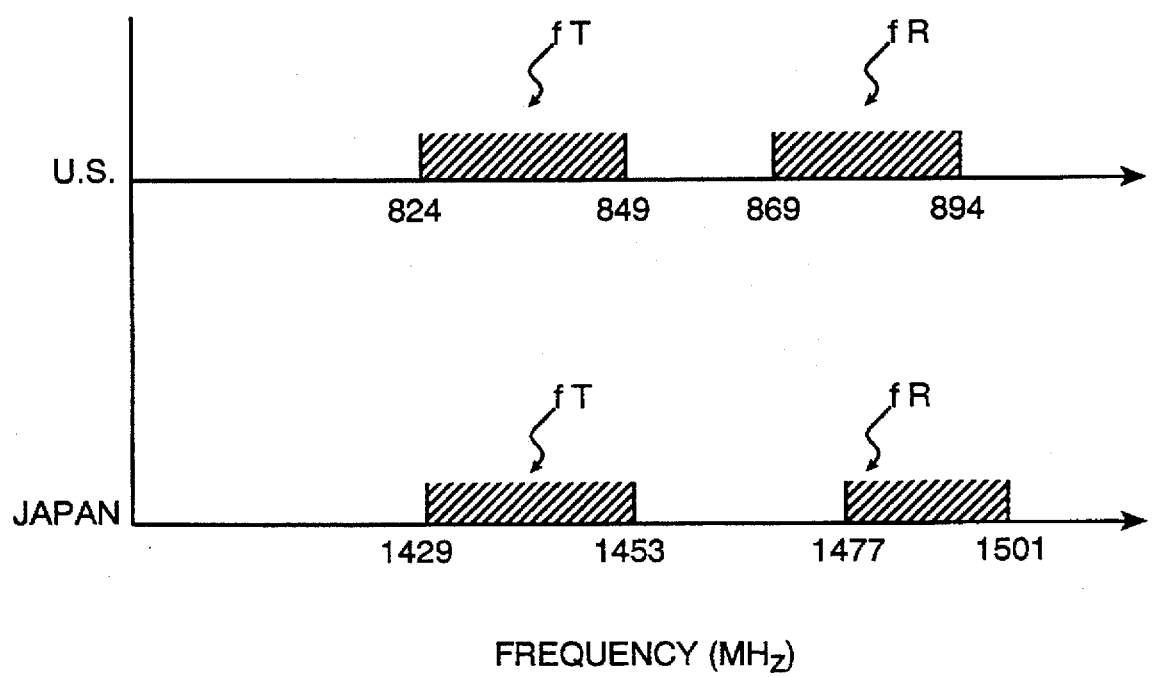
FIG. 5 illustrates frequency arrangements of cellular radio systems.

FIG. 5 shows the frequency arrangement of the U.S. analog cellular radio system and that of the Japan digital cellular radio system. In the case of the U.S. example, the frequency band of 824 to 849 MHz is assigned to a transmission frequency (fT) and the frequency band of 869 to 894 MHz is assigned to a reception frequency (fR). In the case of the Japan, 1.5 GHz-band digital cellular radio system, 1,429 to 1,453 MHz is assigned to a transmission band and 1,477 to 1,501 MHz is assigned to a reception band. With a duplex system that simultaneously transmits and receives, such as in a cellular radio system, the transmission band is set on the low frequency side of the reception band, in most cases. Therefore, a receiving filter, requires a very steep cutoff frequency characteristic in which the reception band is used as a pass band and the transmission band is used as a stop band. The characteristics shown in FIGS. 4(a), 4(b) and 4(c) meet the above requirement. The relation between the transmission band width and the reception band width and the relation of frequency interval between the transmission band and the reception band slightly differ according to the system designs of various countries. The positional relation between the pass band and the stop band is optimally set by adequately selecting the relation between (N1+N3) and N2 according to the present invention, as shown in the analysis of FIGS. 4(a), 4(b) and 4(c).

Figure 6:
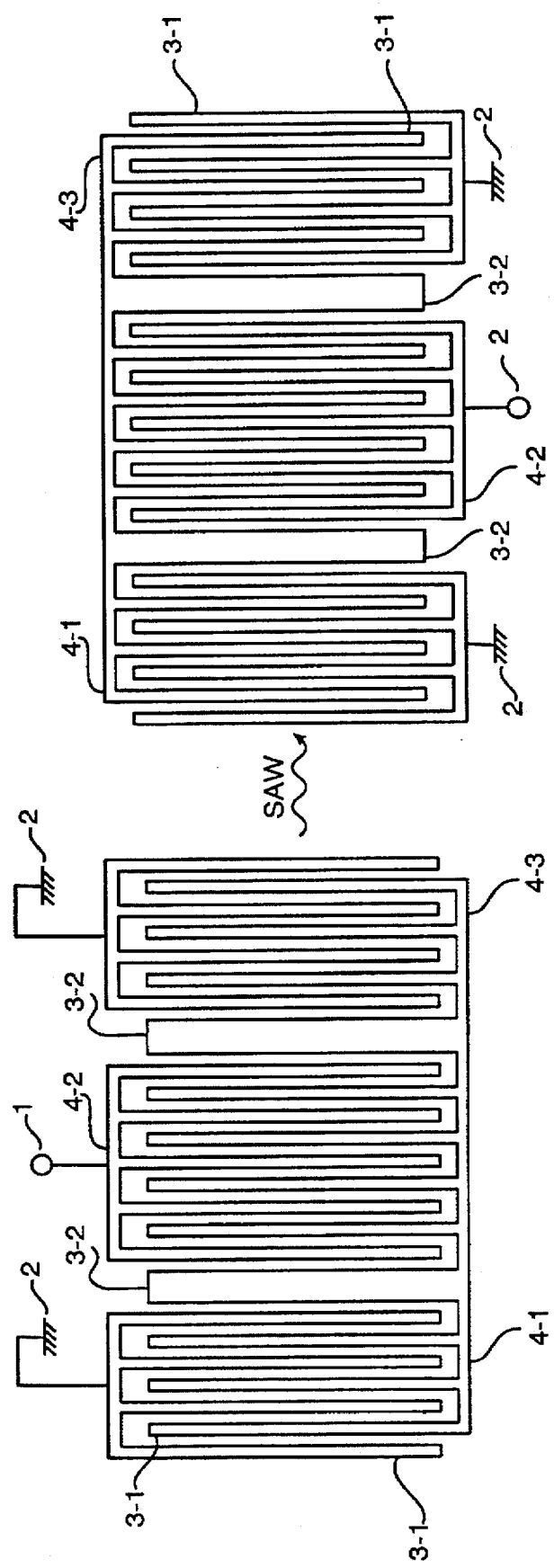
FIG. 6 illustrates a filter of the present invention.
Figure 7:
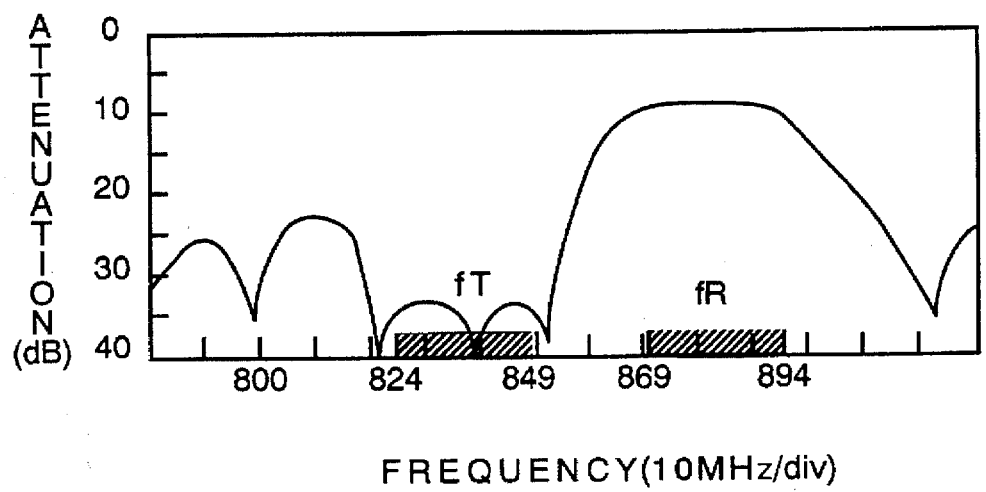
FIG. 7 illustrates the frequency characteristic of the filter of FIG. 6.

FIGS. 6 and 7 show a simple SAW-filter structure (using the IDTs of FIG. 3 as input and output IDTs, for excitation and reception) and its frequency characteristic. FIG. 6 shows two IDTs of FIG. 3 arranged so that they face each other; a voltage is applied to the input electric terminal 1-1 of the exciting IDT and a voltage is outputted from the output electric terminal 1-2 of the receiving IDT. This example uses 64° YX-LiNbO$_3$ having an electromechanical coupling coefficient $k^2$ of 0.11 as the piezoelectric substrate. The numbers of electrode finger pairs constituting the input and output IDTs are: for FIG. 6 N1=4.5, N2=5, and N3=4.5. In this case, (N1+N3)=1.8×N2. Transmission and reception frequencies conform to the frequency arrangement of the U.S. analog cellular radio system. The loss in the pass band of the reception band fR of 869–894 MHz is about 10 dB, and the amount of attenuation in the stop band of the transmission band fT of 824–849 MHz is about 35 dB. The cutoff frequency characteristic from the stop band to the pass band is steep.

Figure 8:
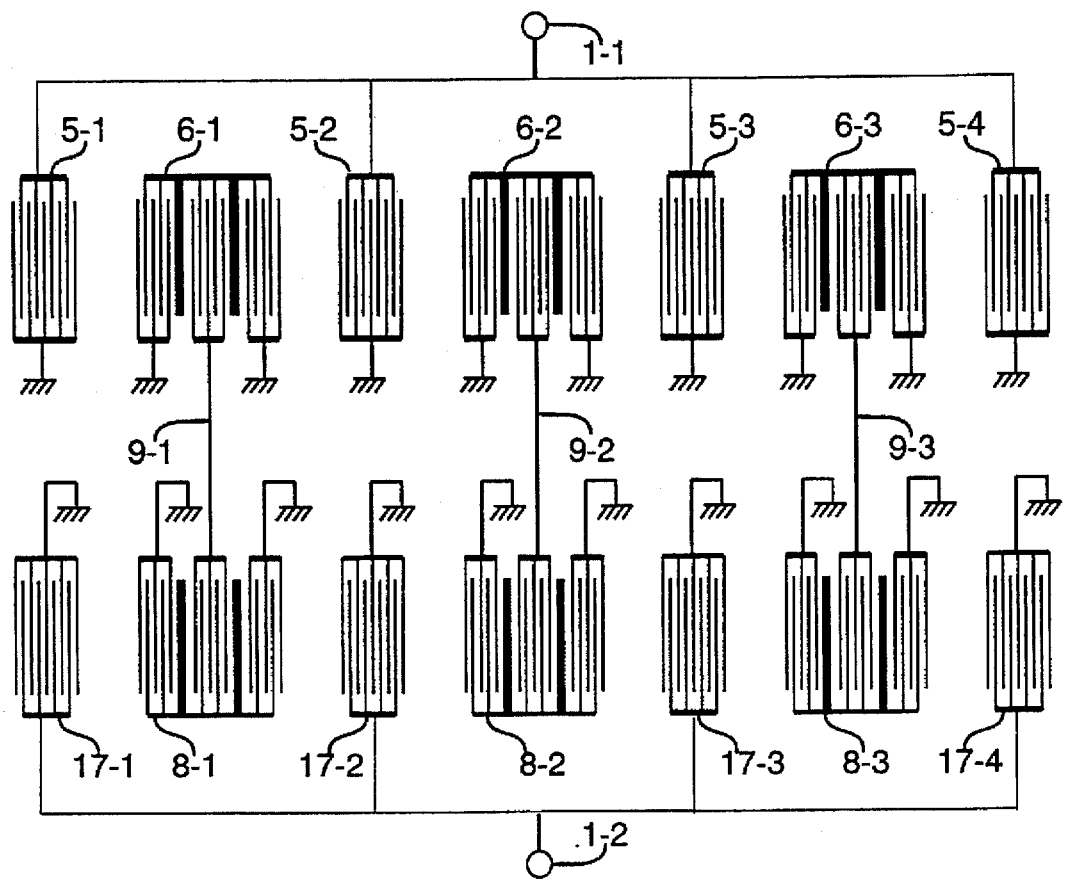
FIG. 8 illustrates a filter of the present invention.
Figure 9:
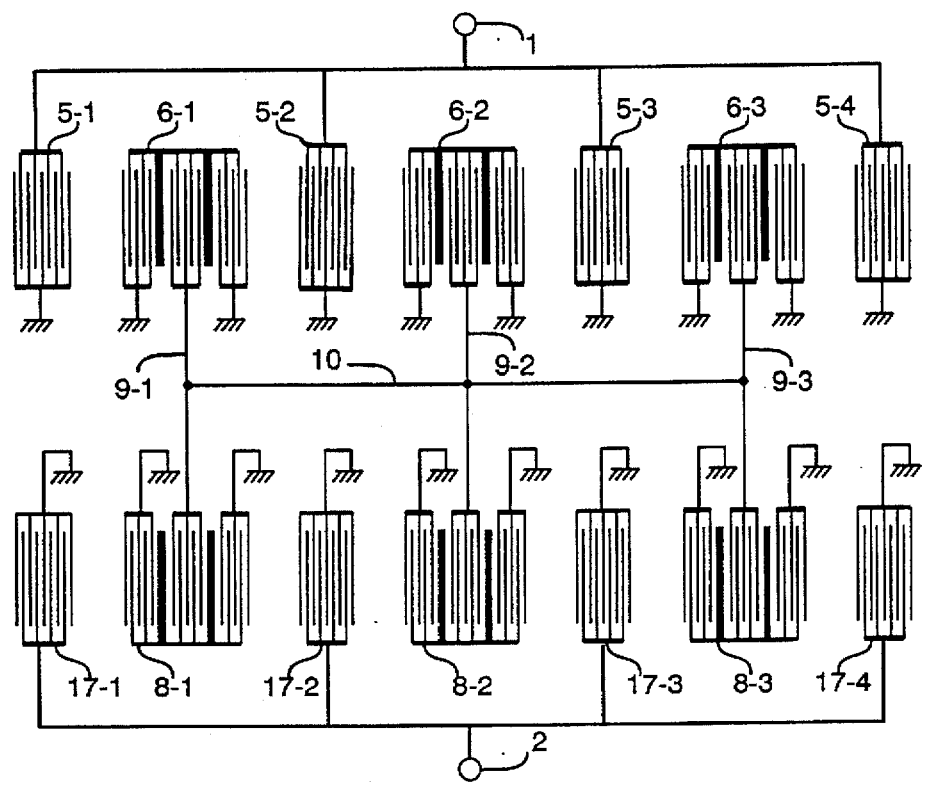
FIG. 9 illustrates a filter of the present invention.

In FIG. 8, a plurality of separated input first IDTs (5-1, 5-2, 5-3, 5-4) are arranged in the direction of propagation of one SAW and are electrically connected to each other in parallel to form an input electric terminal (1-1). A plurality of second IDTs (6-1, 6-2, 6-3) are electrically isolated from the input IDTs and are arranged between the separated input IDTs in the direction of propagation of the SAW on the input side so that the second IDTs and the separated input first IDTs are interdigitized. A plurality of separated output third IDTs (7-1, 7-2, 7-3, 7-4) are electrically isolated from the first input and second IDTs and are arranged in the direction of propagation of the SAW on the output side. Furthermore, the output IDTs are electrically connected to each other in parallel to form an output electric terminal 1-2. A plurality of fourth separated IDTs (8-1, 8-2, 8-3) are electrically isolated from the output IDTs, and are arranged between the separated output IDTs in the direction of propagation of the SAW on the output side so that the fourth IDTs and the output IDTs are interdigitized. The second IDTs are electrically connected to respective fourth IDTs (9-1, . . . , and 9-3). In the case of FIG. 9, a plurality of second separated IDTs are electrically connected to a plurality of fourth separated IDTs by a busbar 10 in order to temporarily equalize their potentials.

The essence of the present invention of the structures, in FIGS. 8 and 9, is to use the IDTs shown in FIG. 3 for the plurality of second separated IDTs and the plurality of fourth separated IDTs.

The relatively simple SAW filter using one IDT, as each of the input and output IDTs shown in FIG. 6, is restricted to applications in which the loss of the pass band is relatively large and the loss characteristic does not matter very much as shown in FIG. 7.

Mobile radio communication in the European digital cellular radio (Group Special Mobile, GSM) uses a reception band of fR=935–960 MHz and a transmission band of fT=890–915 MHz; the relation between fT and fR is very similar to that of the U.S. analog cellular radio system shown in FIG. 5(a). However, the EGSM (Extended Group Special Mobile) in which fR is 925–960 MHz and fT is 880–915 MHz (wider than the present band width of 25 MHz for fR and fT, by 10 MHz) will be serviced in the near future. Since the band width is widened, the frequency interval between fR and fT is 10 MHz, for the EGSM, though the interval is 20 MHz in the case of the conventional frequency arrangements. Therefore, an extremely steep cutoff frequency characteristic is required for a filter in addition to a wide band characteristic. The filters shown in FIGS. 8 and 9 meet these requirements.

In FIGS. 8 and 9, by applying a voltage to the input electric terminal 1-1, an electric signal is converted into a SAW by the input (first) IDT and the SAW enters the second IDT. The SAW signal is transmitted from the second IDT to the fourth IDT in the form of an electric signal. A SAW is excited by the fourth IDT and output from the output electric terminal 1-2 of the output (third) IDT as an output electric signal. In the conversion and reconversion of electric signals and SAWs between the second and fourth IDTs in the above process, a frequency characteristic is realized which very steeply rises from the stop band to the pass band.

Figure 12:
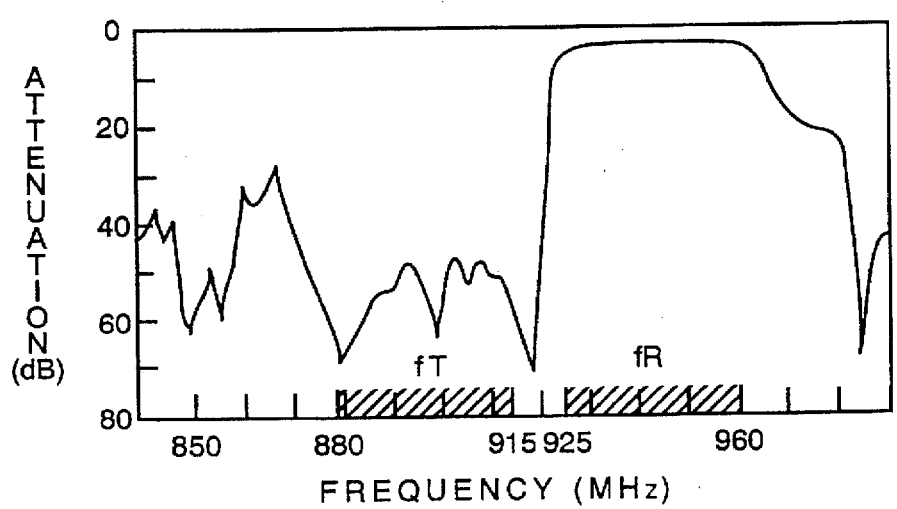
FIG. 12 illustrates the frequency characteristic of a filter of the present invention.

FIG. 12 shows a specific frequency characteristic obtained by using the structure of FIG. 8, in which the piezoelectric substrate uses 64° YX-LiNbO$_3$ and uses the IDTs of N1=N3=3.5 and N2=7 in FIG. 3 as the second and fourth IDTs. The characteristic is obtained in which the loss of the pass band fR is approx. 3 dB and the amount of attenuation of the stop band fT is approx. 45 dB. A filter with a very steep cutoff frequency characteristic is realized which is adapted to fR of 925–960 MHz and fT of 880–915 MHz, which are the frequency arrangement of the ultra-wide-band system EGSM.

As the result of the present inventor's detailed examination through basic experiments and computer simulations, it has been found that the relation between N1, N2 and N3 must meet the inequality of $0.5 \times N2 < (N1+N3) < 3 \times N2$ in order to realize a desired very steep frequency characteristic by electrically connecting the second and fourth IDTs as shown in FIGS. 8 and 9. FIG. 12 shows the case where (N1+N3)=1×N2. By the effect of electrical connection of the second and fourth IDTs in FIGS. 8 and 9, conditions wider than those of the simple filter structure of FIG. 6 are allowed for N1, N2 and N3. To adapt filters to specific mobile radio communication systems at present or expected in the future, an extremely steep characteristic is required. Therefore, in the case of the structures of FIGS. 8 and 9, it may be more effective to set (N1+N3) to about 0.5×N2, i.e., smaller than N2. In spite of such a setting, the decrease of the amount of attenuation on the low frequency side of the stop band is controlled to approximately 30 dB. Therefore, it is lower than the level that cannot be ignored in practical use.

All the IDTs have a range of $2/k^2 \geq N1+N2+N3 \geq 0.8/k^2$, using the electromechanical coupling coefficient $k^2$ as mentioned before. In the case of 64° YX-LiNbO$_3$ of FIG. 12, $2/k^2=18 \geq (N1+N2+N3)=14 \geq 0.8/k^2=7$, because (N1+N2+N3)=14 for $k^2=0.11$.

Figure 10:
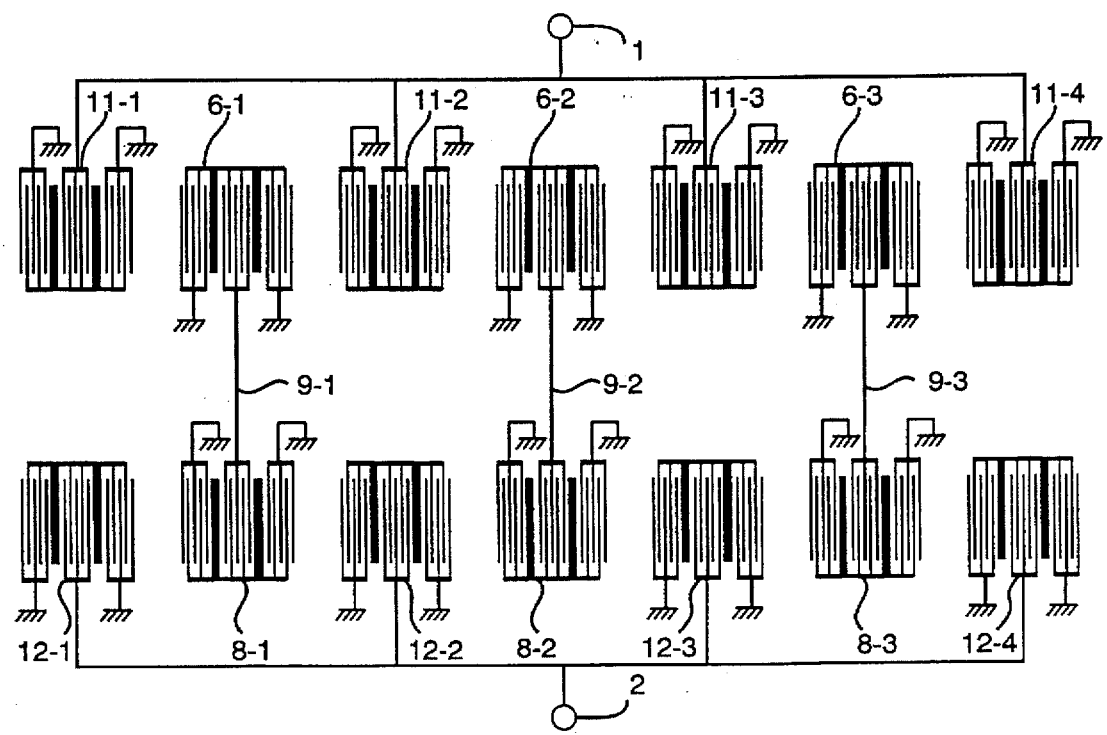
FIG. 10 illustrates a filter of the present invention.
Figure 11:
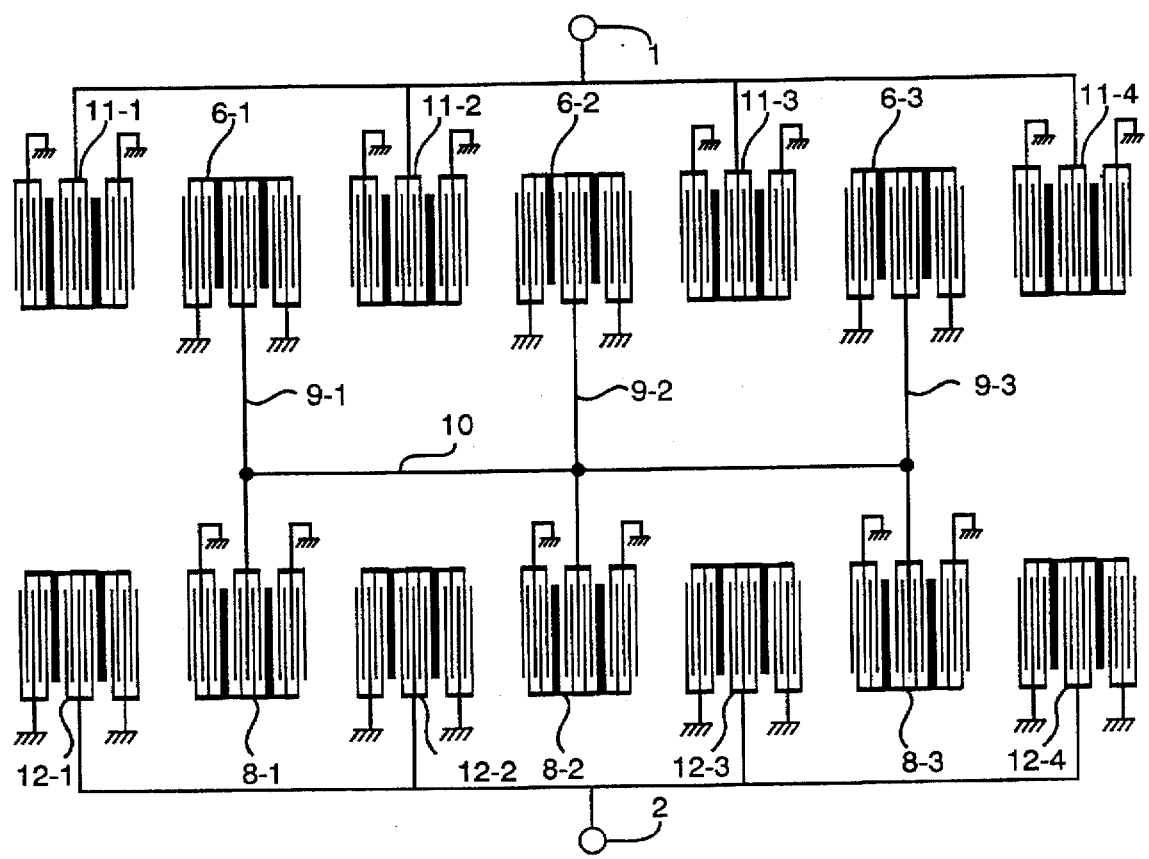
FIG. 11 illustrates a filter of the present invention.

FIGS. 10 and 11 show examples using the IDTs shown in FIG. 3 as the input (first) IDT and the output (third) IDT, similarly to the cases of FIGS. 8 and 9. That is, these examples use IDT-1, IDT-2 and IDT-3 having N1 pairs, N2 pairs and N3 pairs, respectively. The IDT-1 is electrically connected to the IDT-3 in parallel, and the IDT-2 is electrically connected in series to each of the IDT-1 and IDT-3, as their input and output IDTs. In this case, when the numbers of electrode finger pairs N1, N2 and N3 of the input and output IDTs meet the inequality N2<(N1+N3)<3×N2, like in the case of FIG. 6, it is expected that the amount of attenuation is further improved.

In the case of FIG. 12, for example, a frequency band whose amount of attenuation decreases to approx. 30 dB is present on the low frequency side of the stop band, with fT of 880 to 915 MHz. It has been found that a very steep cutoff frequency characteristic and an attenuation characteristic covering a wide frequency range can be coexistent by optimally determining N1, N2 and N3 of the input and output IDTs and designing the filter so that the frequency band in which the amount of attenuation decreases coincides with the stop band of the input and output IDTs.

Figure 13:
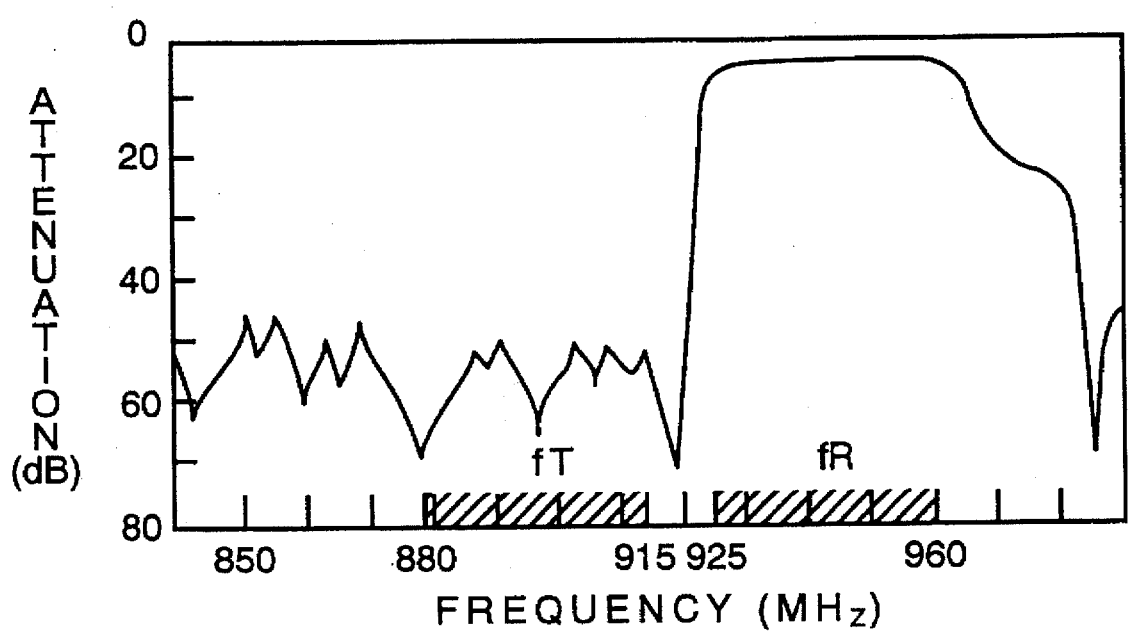
FIG. 13 illustrates the frequency characteristic of a filter of the present invention.

FIG. 13 shows a specific characteristic obtained by using the structure of FIG. 10, in which the input and output IDTs have electrode finger pairs, N1=N3=3.5, N2=4 and (N1+N3)=1.75×N2. From FIG. 13, it is understood that the attenuation characteristic on the low frequency side of the stop band is greatly improved compared to the case of FIG. 12, and approx. 40 dB of the amount of attenuation is ensured.

Figure 14:
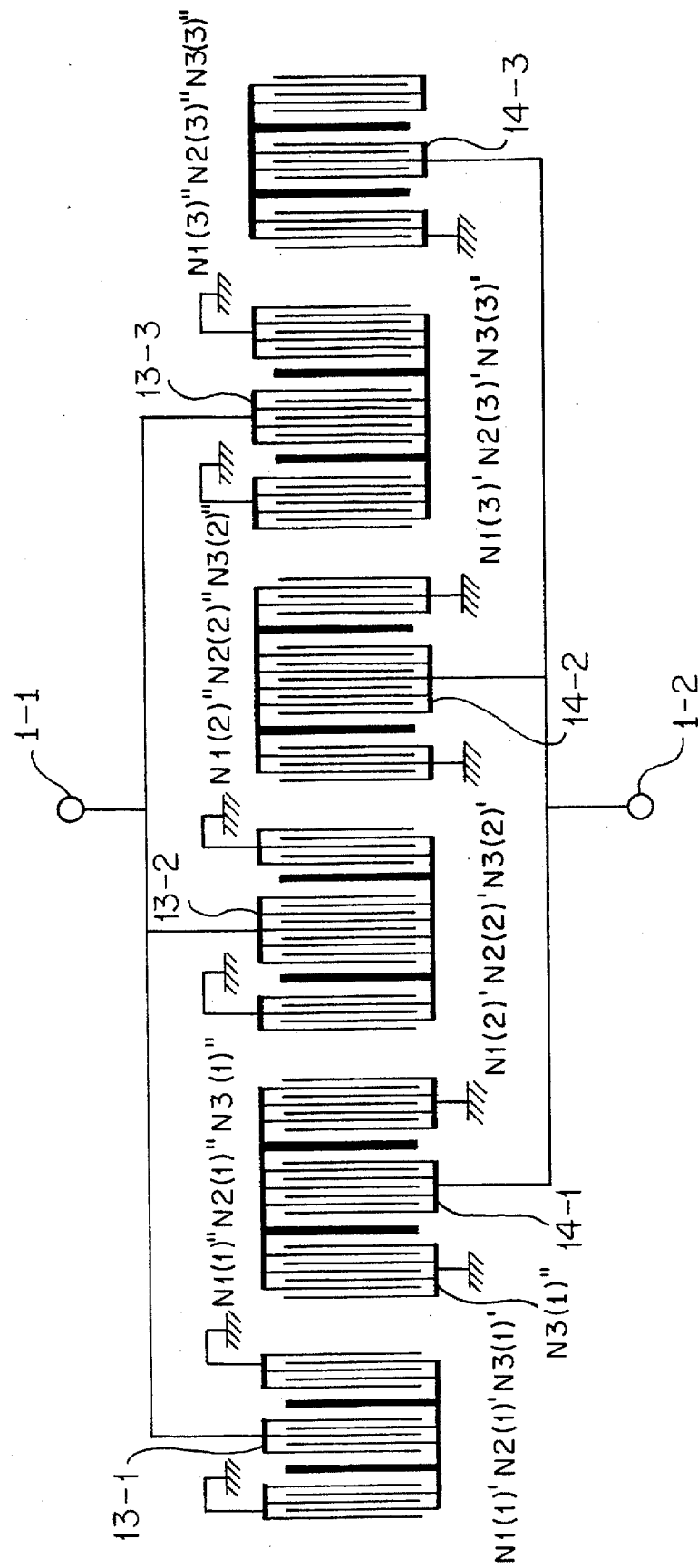
FIG. 14 illustrates a filter of the present invention.

In FIG. 14 a plurality of separated input IDTs 13-1, . . . , and 13-3 are arranged in the direction of propagation of a SAW and electrically connected to each other in parallel to form an input electric terminal 1-1. A plurality of separated output IDTs 14-1, . . . , and 14-3 are electrically isolated from the input IDTs and are arranged between the input IDTs in the direction of propagation of the SAW, so that the output IDTs and the input IDTs are interdigitized. The output IDTs are electrically connected to each other in parallel to form an output electric terminal 1-2, similarly to the connection of the input IDTs. The IDTs of FIG. 3 are used as the plurality of separated input IDTs and the plurality of separated output IDTs in constructing FIG. 14, to realize a steep frequency characteristic, a wide band with a small loss, and ensure the amount of attenuation covering a wide frequency band, by changing the relation between N1, N2 and N3 of the plurality of input IDTs and of the plurality of output IDTs. However, in FIG. 14, the individual numbers of pairs of the IDTs are exaggeratedly shown, so as to make the description easily understandable and does not show the structure itself of the embodiment of the present invention.

In FIG. 14, the numbers of electrode finger pairs of the input side IDTs are marked with the symbol ' and the numbers of electrode finger pairs of the output side IDTs are marked with the symbol ". Moreover, the numbers of three IDTs corresponding to the IDTs of FIG. 3 are expressed by N1, N2 and N3 similarly to the previous expression. Therefore, as shown in FIG. 14, the numbers of pairs of the input side IDTs are shown as N1(i)', N2(i)' and N3(i)' and the numbers of pairs of the output side IDTs are shown as N1(j)", N2(j)" and N3(j)". Here, i and j correspond to i=1,2,3, . . . and j=1,2,3, . . . respectively from the left side of the plurality of separated input side IDTs and from the left side of the plurality of separated output side IDTs. The present invention is characterized in the relation between (N1(i)'+N3(i)') and N2(i)' or the relation between (N1(j)"+ N3(j)") and N2(j)", which is different for the plurality of separated IDTs, that is, for i=1,2,3, . . . and j=1,2,3, . . . of the input or output side IDTs in the structure of FIG. 14.

Figure 15:
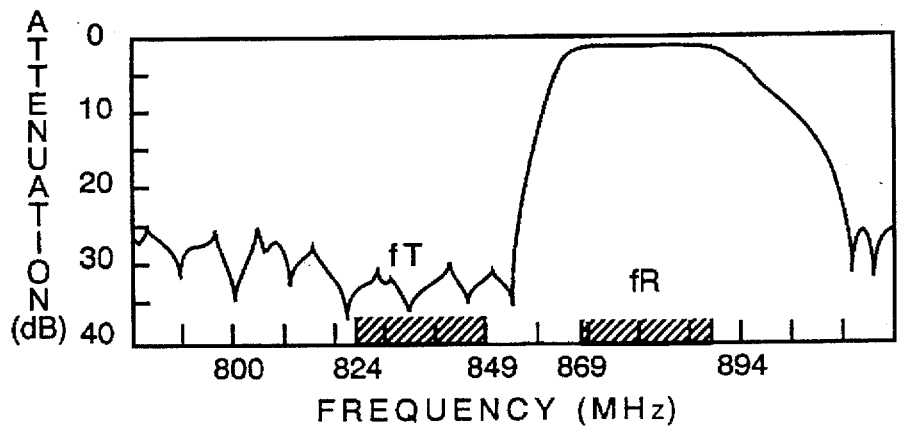
FIG. 15 illustrates an embodiment of the present invention.

FIG. 15 shows a specific frequency characteristic of a piezoelectric substrate that uses 64° YX-LiNbO$_3$, five IDTs (i=1–5) on the input side and five IDTs (j=1–5) on the output side, which IDTs are interdigitized. In FIG. 15, the following combinations are used for the input side, that is, for i:

N1(1)'=N3(1)'=2.5,N2(1)'=4
N1(2)'=N3(2)'=3.5,N2(2)'=5
N1(3)'=N3(3)'=3.5,N2(3)'=8
N1(4)'=N3(4)'=3.5,N2(4)'=5
N1(5)'=N3(5)'=2.5,N2(5)'=4

The following combinations are used for the output side, that is, for j.

N1(1)"=N3(1)"=2.5,N2(1)"=3
N1(2)"=N3(2)"=3.5,N2(2)"=6
N1(3)"=N3(3)"=3.5,N2(3)"=8
N1(4)"=N3(4)"=3.5,N2(4)"=6
N1(5)"=N3(5)"=2.5,N2(5)"=3

As will be seen from the characteristic of FIG. 15, the loss is 1.5 dB and an almost uniform amount of attenuation, approx. 25 dB, is ensured. The cutoff characteristic on the low frequency side is steep. Any frequency band in which the amount of attenuation decreases is not present in FIG. 7 on the lower frequency side of the stop band. This is because it is possible to make characteristics other than the pass band different between separated IDTs, by changing the relation between N1, N2 and N3 of separated input side IDTs or separated output side IDTs, though the frequency characteristics of the pass bands of all the IDTs are almost common. These different frequency characteristics are combined in the filter. However, the phases and amplitudes are different almost randomly for the IDTs. Therefore, as a result, the attenuation characteristic is almost flat. Moreover, (N1+N2+N3) of the individual IDTs is within a range from 0.8/k$^2$ to 2/k$^2$, as described before for optimum frequency characteristic, when a piezoelectric substrate is used. The piezoelectric substrate, a preferred substrate, is most preferably a 2 mm$^2$ chip of large electromechanical coupling characteristic coefficient k$^2$ being in the range of 0.16 to 0.11 or if of a small coefficient, then k$^2$ is within the range of 0.053 to 0.001.

In the above examples, N1=N3. In the case where N1$^1$N3, it has been confirmed that the frequency characteristic of the filter does not greatly change, i.e. only slightly changes.

Figure 16:
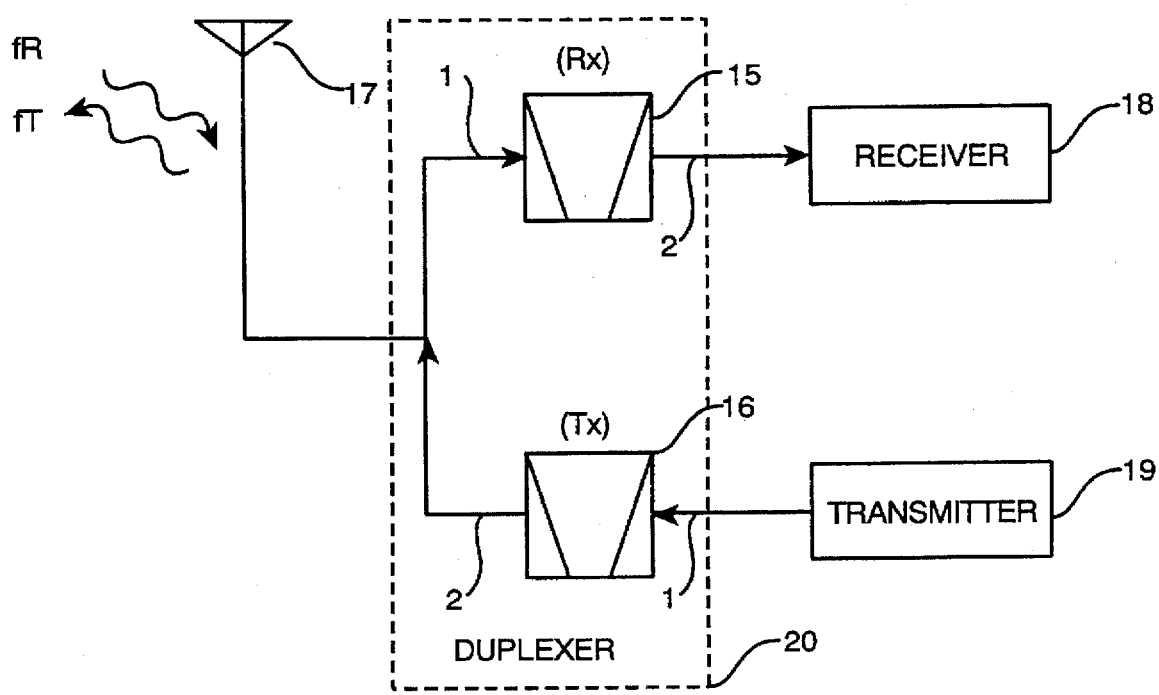
FIG. 16 illustrates an embodiment of the present invention.

In FIG. 16, a duplex system simultaneously transmits and receives as a cellular radio communication system. One antenna is used both by a receiver and a transmitter as shown in FIG. 16. As shown in FIG. 16, the antenna duplexer comprises a receiving filter 15 and a high frequency transmitting filter 16. The input terminal of the receiving filter 15 is connected to the output terminal of the transmitting filter 16 in parallel, and they are used as an antenna terminal. The output terminal of the receiving filter 15 is used as a receiver terminal. The input terminal of the transmitting filter 16 is used as a transmitter terminal. As described with reference to FIG. 5, in the case of a cellular radio or the like, the transmission band fT is often lower in frequency than the reception band fR. Therefore, receiving filter 15 ensures that the amount of attenuation in the transmission band prevents the receiving sensitivity from deteriorating due to a high transmission power of the transmission band entering the receiver, because of the frequency characteristic of the present invention filter.

As the result of the present inventor's study through basic experiments and computer simulations, it has been confirmed that electrical specifications of a terminal of a cellular radio communication system, or the like, are almost satisfied even if the filter of the present invention is used for the receiving filter 15 of the duplexer. In this case, the volume of the duplexer can be decreased to a fraction by using a SAW filter, as compared to a conventional duplexer comprising a dielectric resonator type filter. Therefore, use of the surface acoustic wave filter of the present invention greatly contributes to downsizing of a communication device terminal, particularly a radio communication device terminal.

Figure 17:
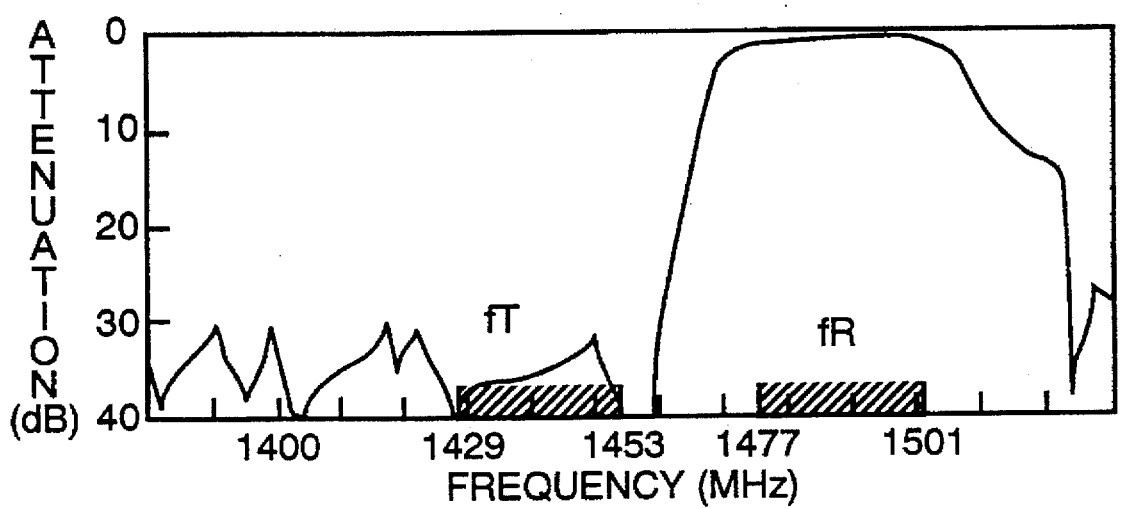
FIG. 17 illustrates the frequency characteristic of a filter of the present invention.

The above embodiments use 64° YX-LiNbO$_3$ as the piezoelectric substrate. However, in the case of a filter of a relatively high frequency used as in the 1.5 GHz-band digital cellular radio shown in FIG. 5(b), the fluctuation of the center frequency of the filter due to temperature change cannot be ignored. Therefore, it is better to use LiTaO$_3$, which is superior to LiNbO$_3$ in the temperature characteristic, though the piezoelectric effect is slightly degraded. FIG. 17 shows a characteristic of a filter with respect to the frequency arrangement in FIG. 5(b). The structure of the filter is the same as that of FIG. 14 and the piezoelectric substrate is made of 36° YX-LiTaO$_3$. On the input side, i=1–5, i.e., there are five IDTs. On the output side, j=1–5, i.e., there are five IDTs. The IDTs are interdigitized as shown. The following combinations are used on the input side, that is, for i in the IDTs.

N1(1)'=N3(3)'=7.5, N2(1)'=9
N1(2)'=N3(2)'=8.5, N2(2)'=11
N1(3)'=N3(3)'=9.5, N2(3)'=11
N1(4)'=N3(4)'=8.5, N2(4)'=11
N1(5)'=N3(5)'=7.5, N2(5)'=9

And, the following combinations are used on the output side, that is, for j.

N1(1)"=N3(1)"=7.5, N2(1)"=9
N1(2)"=N3(2)"=8.5, N2(2)"=11
N1(3)"=N3(3)"=9.5, N2(3)"=11
N1(4)"=N3(4)"=8.5, N2(4)"=11
N1(5)"=N3(5)"=7.5, N2(5)"=9

As to the characteristics the loss is 1.6 dB and the amount of attenuation is 30 dB. This filter can be used as the receiving filter 15 of the antenna duplexer shown in FIG. 16, which is adapted to a 1.5 GH-band digital cellular radio.

Figure 18:
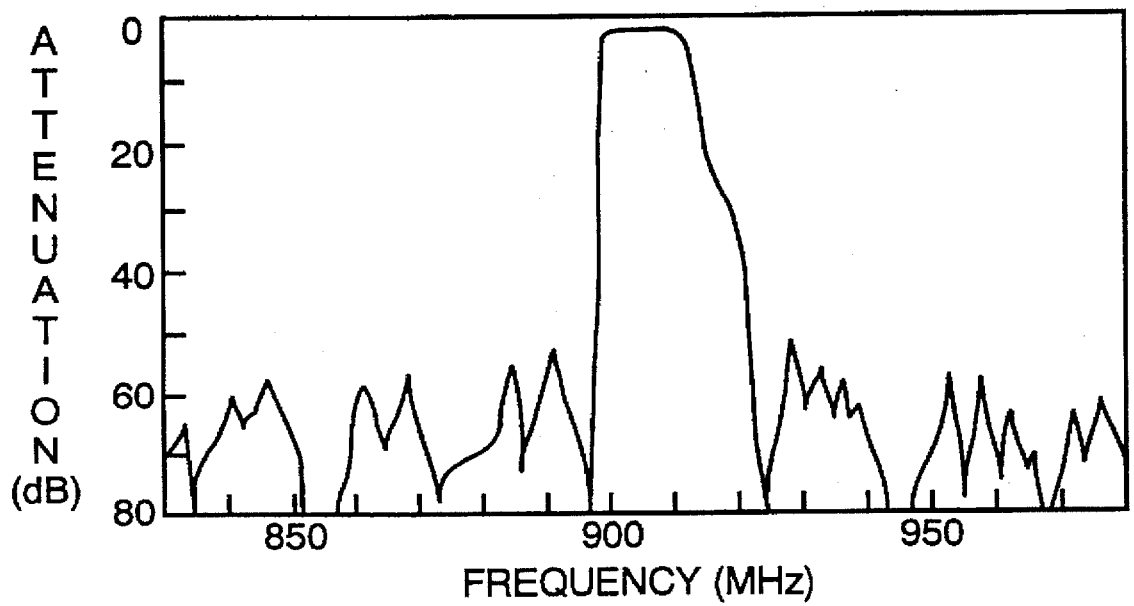
FIG. 18 illustrates the frequency characteristic of a filter of the present invention.

Moreover, a cordless telephone and a pager are known as mobile radio communication devices different from the cellular radio communication device. The distinguishing feature of them is their relatively narrow band widths compared to the cellular radio device. However, a very steep cutoff frequency is required depending on the selection of the intermediate frequency. FIG. 18 shows the characteristic of a filter using Li$_2$B$_4$O$_7$, which has a piezoelectric effect less than that of LiTaO$_3$, which is suitable for a narrow band filter and which is superior to LiTaO$_3$ in the temperature characteristic. The structure of the filter is the same as that of FIG. 9 and thereby, a filter with a narrow band and a very steep cutoff frequency characteristic is realized.

While a preferred embodiment of the present invention has been described in detail, with variations and modifications, further embodiments, variations and modifications are contemplated within the broader aspects of the present invention, in addition to the advantageous details, in accordance with the spirit and scope of the following claims.

We claim:

1. A surface acoustic wave exciting or receiving transducer, comprising:

a piezoelectric substrate having an electromechanical coupling coefficient k$^2$;

at least first, second and third interdigital transducers each having electrode finger pairs, and the number of said pairs being N1, N2 and N3, respectively, for propagating a surface acoustic wave in a direction of propagation in order of the first, second, and third interdigital transducers;

said first interdigital transducer being electrically connected to said third interdigital transducer in parallel;

said second interdigital transducer being electrically connected in series with each of said first and third interdigital transducers; and said numbers of electrode finger pairs N1, N2 and N3 of said first, second and third interdigital transducers being related so that $N2<(N1+N3)<3\times N2$, and so that $2/k^2 \geq (N1+N2+N3) \geq 0.8/k^2$.

2. A surface acoustic wave filter according to claim 1, wherein one of said the first surface acoustic wave exciting transducers and said second surface acoustic wave receiving transducers each comprise fourth, fifth, and sixth interdigital transducers having numbers of electrode finger pairs N1', N2' and N3', respectively, and which pairs are formed on said piezoelectric substrate in at least one of said first and second directions of propagation in order of the fourth, fifth, and sixth interdigital transducers;

said fourth interdigital transducer being electrically connected to said sixth interdigital transducer in parallel;

said fifth interdigital transducer being electrically connected in series with each of said fourth and sixth interdigital transducers; and said numbers of electrode finger pairs N1', N2' and N3' satisfying the following relations $N2'<(N1'+N3')<3\times N2'$, and $2/k^2 \geq (N1'+N2'+N3') \geq 0.8/k^2$.

3. A surface acoustic wave filter according to claim 1, wherein said piezoelectric substrate is formed of a non-piezoelectric substrate and a film of at least one of lithium niobate ($LiNbO_3$), lithium tantalate ($LiTaO_3$), lithium tetraborate ($Li_2B_4O_7$), quartz and zinc oxide (ZnO).

4. A surface acoustic wave filter having an input terminal and an output terminal, said filter comprising:

a piezoelectric substrate for propagating a surface acoustic wave and having an electromechanical coupling coefficient $k^2$;

a plurality of first surface-acoustic-wave exciting transducers connected to the input terminal and formed on said piezoelectric substrate in a first direction of propagation of a first surface acoustic wave;

a plurality of first surface acoustic wave receiving transducers electrically isolated from said first surface acoustic wave exciting transducers and formed on said piezoelectric substrate in the first direction of propagation so that said first surface acoustic wave receiving transducers and said first surface acoustic wave exciting transducers are interdigitated;

a plurality of second surface acoustic wave exciting transducers electrically connected to said first surface acoustic wave receiving transducers respectively and formed on said piezoelectric substrate in a second direction of propagation of a second surface acoustic wave; and a plurality of second surface acoustic wave receiving transducers electrically isolated from said second surface acoustic wave exciting transducers, and formed on said piezoelectric substrate in the second direction of propagation so that said second surface acoustic wave receiving transducers and said second surface acoustic wave exciting transducers are interdigitated, connected to the output terminal; wherein one of said first surface acoustic wave receiving transducers and said second surface acoustic wave exciting transducers each comprise first, second, and third interdigital transducers having electrode finger pairs in numbers of N1, N2 and N3, respectively;

said finger pairs being formed on said piezoelectric substrate in at least one of the first and second direction of propagation in order of the first, second and third interdigital transducers;

said first interdigital transducer being electrically connected to said third interdigital transducer in parallel;

said second interdigital transducer being electrically connected to each of said first and third interdigital transducers in series; and wherein said numbers of electrode finger pairs N1, N2 and N3 being related so that $0.5\times N2<(N1+N3)<3\times N2$, and so that $2/k^2 \geq (N1+N2+N3) \geq 0.8/k^2$.

5. A surface acoustic wave filter according to claim 4, wherein one of said the first surface acoustic wave exciting transducers and said second surface acoustic wave receiving transducers each comprise fourth, fifth, and sixth interdigital transducers having numbers of electrode finger pairs N1', N2' and N3', respectively, and which pairs are formed on said piezoelectric substrate in at least one of said first and second directions of propagation in order of the fourth, fifth, and sixth interdigital transducers;

said fourth interdigital transducer being electrically connected to said sixth interdigital transducer in parallel;

said fifth interdigital transducer being electrically connected in series with each of said fourth and sixth interdigital transducers; and said numbers of electrode finger pairs N1', N2' and N3' satisfying the following relations $N2'<(N1'+N3')<3\times N2'$, and $2/k^2 \geq (N1'+N2'+N3') \geq 0.8/k^2$.

6. A surface acoustic wave filter according to claim 4, wherein said piezoelectric substrate is formed of a non-piezoelectric substrate and a film of at least one of lithium niobate ($LiNbO_3$), lithium tantalate ($LiTaO_3$), lithium tetraborate ($Li_2B_4O_7$), quartz and zinc oxide (ZnO).

7. A surface acoustic wave filter having an input terminal and an output terminal, comprising:

a piezoelectric substrate for propagating a surface acoustic wave and having an electromechanical coupling coefficient $k^2$;

a plurality of first surface acoustic wave exciting transducers connected to the input terminal and formed on said piezoelectric substrate in a first direction of propagation of a first surface acoustic wave;

a plurality of first surface acoustic wave receiving transducers electrically isolated from said first surface acoustic wave exciting transducers, and formed on said piezoelectric substrate in the first direction of propagation;

a busbar;

said first surface acoustic wave receiving transducers and said first surface acoustic wave exciting transducers being interdigitated and electrically connected to said busbar for temporarily equalizing their potentials;

a plurality of second surface acoustic wave exciting transducers electrically connected to said busbar and formed on said piezoelectric substrate in the second direction of propagation;

a plurality of second surface acoustic wave receiving transducers electrically isolated from said second surface acoustic wave exciting transducers, respectively and formed on said piezoelectric substrate in the second direction of propagation;

said second surface acoustic wave receiving transducers and said second surface acoustic wave exciting transducers being interdigitated and connected to the output terminal;

one of said first surface acoustic wave receiving transducers and said second surface acoustic wave exciting transducers each comprise first, second and third interdigital transducers having numbers of electrode finger pairs N1, N2 and N3, respectively and being formed on said piezoelectric substrate in one of the first and second directions of propagation in order of the first, second and third interdigital transducers;

said first interdigital transducer being electrically connected to said third interdigital transducer in parallel;

said second interdigital transducer being electrically connected in series to said first and third interdigital transducers; and said numbers of electrode finger pairs N1, N2 and N3 being related to so that $0.5'N2 < N1+N3 < 3'N2$ and so that $2/k^2 \geq (N1+N2+N3) \geq 0.8/k^2$.

8. A surface acoustic wave filter according to claim 7, wherein one of said the first surface acoustic wave exciting transducers and said second surface acoustic wave receiving transducers each comprise fourth, fifth, and sixth interdigital transducers having numbers of electrode finger pairs N1', N2' and N3', respectively, and which pairs are formed on said piezoelectric substrate in at least one of said first and second directions of propagation in order of the fourth, fifth, and sixth interdigital transducers;

said fourth interdigital transducer being electrically connected to said sixth interdigital transducer in parallel;

said fifth interdigital transducer being electrically connected in series with each of said fourth and sixth interdigital transducers; and said numbers of electrode finger pairs N1', N2' and N3' satisfying the following relations $N2' < (N1'+N3') < 3 \times N2'$, and $2/k^2 \geq (N1'+N2'+N3') \geq 0.8/k^2$.

9. A surface acoustic wave filter according to claim 7, wherein said piezoelectric substrate is formed of a non-piezoelectric substrate and a film of at least one of lithium niobate ($LiNbO_3$), lithium tantalate ($LiTaO_3$), lithium tetraborate ($Li_2B_4O_7$), quartz and zinc oxide (ZnO).

10. A surface acoustic wave filter having an input terminal and an output terminal, comprising:

a piezoelectric substrate for propagating a surface acoustic wave and having an electromechanical coupling coefficient $k^2$;

a plurality of surface acoustic wave exciting transducers connected to the input terminal and formed on said piezoelectric substrate in a direction of propagation of the surface acoustic wave;

a plurality of surface acoustic wave receiving transducers electrically isolated from said surface acoustic wave exciting transducers connected to the output terminal, respectively, and formed on said piezoelectric substrate in the direction of propagation;

said surface acoustic wave receiving transducers and said surface acoustic wave exciting transducers being interdigitated and connected to the output terminal;

said surface acoustic wave exciting transducers and said surface acoustic wave receiving transducers each comprise first, second and third interdigital transducers having numbers of electrode finger pairs N1, N2 and N3, respectively, and which pairs are formed on said piezoelectric substrate in the direction of propagation in order of said first, second, and third interdigital transducers;

said first interdigital transducer being electrically connected to said third interdigital transducer in parallel;

said second interdigital transducer being electrically connected in series with said first and third interdigital transducers; and said numbers of electrode finger pairs N1, N2 and N3 being related so that $0.5'N2 < (N1+N3) < 3'N2$ and so that $2/k^2 \geq (N1+N2+N3) \geq 0.8/k^2$.

11. A surface acoustic wave filter according to claim 10, wherein said piezoelectric substrate is formed of a non-piezoelectric substrate and a film of at least one of lithium niobate ($LiNbO_3$), lithium tantalate ($LiTaO_3$), lithium tetraborate ($Li_2B_4O_7$), quartz and zinc oxide (ZnO).

12. An antenna duplexer including a receiving filter constituted by the surface acoustic wave filter according to any one of claims 2, 4 or 7, in combination with a transmitting filter having an output terminal connected in parallel with the input terminal of the receiving filter to be a terminal for an antenna;

the output terminal of the receiving filter being a terminal for a receiver; and the input terminal of the transmitting filter being a terminal for a transmitter.

13. A surface acoustic wave filter according to claim 12, wherein said piezoelectric substrate is formed of a non-piezoelectric substrate and a film of at least one of lithium niobate ($LiNbO_3$), lithium tantalate ($LiTaO_3$), lithium tetraborate ($Li_2B_4O_7$), quartz and zinc oxide (ZnO).

14. A surface acoustic wave filter according to claim 10, wherein, when the relation between said numbers of electrode finger pairs N1, N2 and N3 is expressed by $N1+N3 = K \times N2$, the value K of one surface acoustic wave exciting transducer is different from that of another surface acoustic wave exciting transducer.

15. A surface acoustic wave filter according to claim 10, wherein when the relation between said numbers of electrode finger pairs N1, N2 and N3 is expressed by $N1+N3 = K \times N2$, the value K of one surface acoustic wave receiving transducer is different from that of another surface acoustic wave receiving transducer.

16. A surface acoustic wave filter according to claim 10, wherein, when the relation between said numbers of electrode finger pairs N1, N2 and N3 is expressed by $N1+N3 = K \times N2$, the values K of two surface acoustic wave receiving transducers adjacent to one of the surface acoustic wave exciting transducers are different.

17. A surface acoustic wave filter according to claim 10, wherein, when the relation between said numbers of electrode finger pairs N1, N2 and N3 is expressed by $N1+N3 = K \times N2$, the values K of two surface acoustic wave exciting transducers adjacent to one of the surface acoustic wave receiving transducers are different.

* * * * *